(12) United States Patent
Kwon et al.

(10) Patent No.: US 7,592,845 B2
(45) Date of Patent: Sep. 22, 2009

(54) INPUT SIGNAL LEVEL DETECTION APPARATUS AND METHOD

(75) Inventors: Dae-hoon Kwon, Anyang-si (KR); Jeong-won Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/127,172

(22) Filed: May 27, 2008

(65) Prior Publication Data

US 2009/0174436 A1 Jul. 9, 2009

(30) Foreign Application Priority Data

Jan. 4, 2008 (KR) .................. 10-2008-0001436

(51) Int. Cl.
*H03K 5/22* (2006.01)
(52) U.S. Cl. .................. 327/70; 327/63; 327/72; 327/108; 327/333; 327/347
(58) Field of Classification Search .................. 327/60, 327/63–72, 78, 108, 110, 333, 347, 348; 324/132; 328/144; 364/841
See application file for complete search history.

(56) References Cited

U.S. PATENT DOCUMENTS 4,023,099 A 5/1977 Van Kessel et al.
5,027,060 A 6/1991 Fraisse
5,290,991 A * 3/1994 Levain et al. .......... 219/121.69
6,218,902 B1 * 4/2001 Kung .................. 330/261
6,229,352 B1 * 5/2001 Chevallier et al. ........... 327/77

FOREIGN PATENT DOCUMENTS

WO    WO 2004/106950    12/2004

OTHER PUBLICATIONS

International Search Report dated Jun. 30, 2008 of the PCT International Application No. PCT/KR2008/002967.

* cited by examiner

*Primary Examiner*—Long Nguyen
*Assistant Examiner*—Shikha Goyal
(74) *Attorney, Agent, or Firm*—Stein McEwen, LLP

(57) ABSTRACT

A method and an input signal level detection apparatus that correctly detect a level of an input signal while consuming low power apparatus including: a full-wave rectifier outputting a full-wave rectified waveform by performing a full-wave rectification on a first signal corresponding to an input signal, and on a second signal having a phase difference of 180 degrees from the first signal; a common voltage detector detecting a common voltage of the first signal and the second signal; and a level detection unit detecting a level of the input signal, based on a subtraction result obtained by subtracting the common voltage from the full-wave rectified waveform.

18 Claims, 3 Drawing Sheets

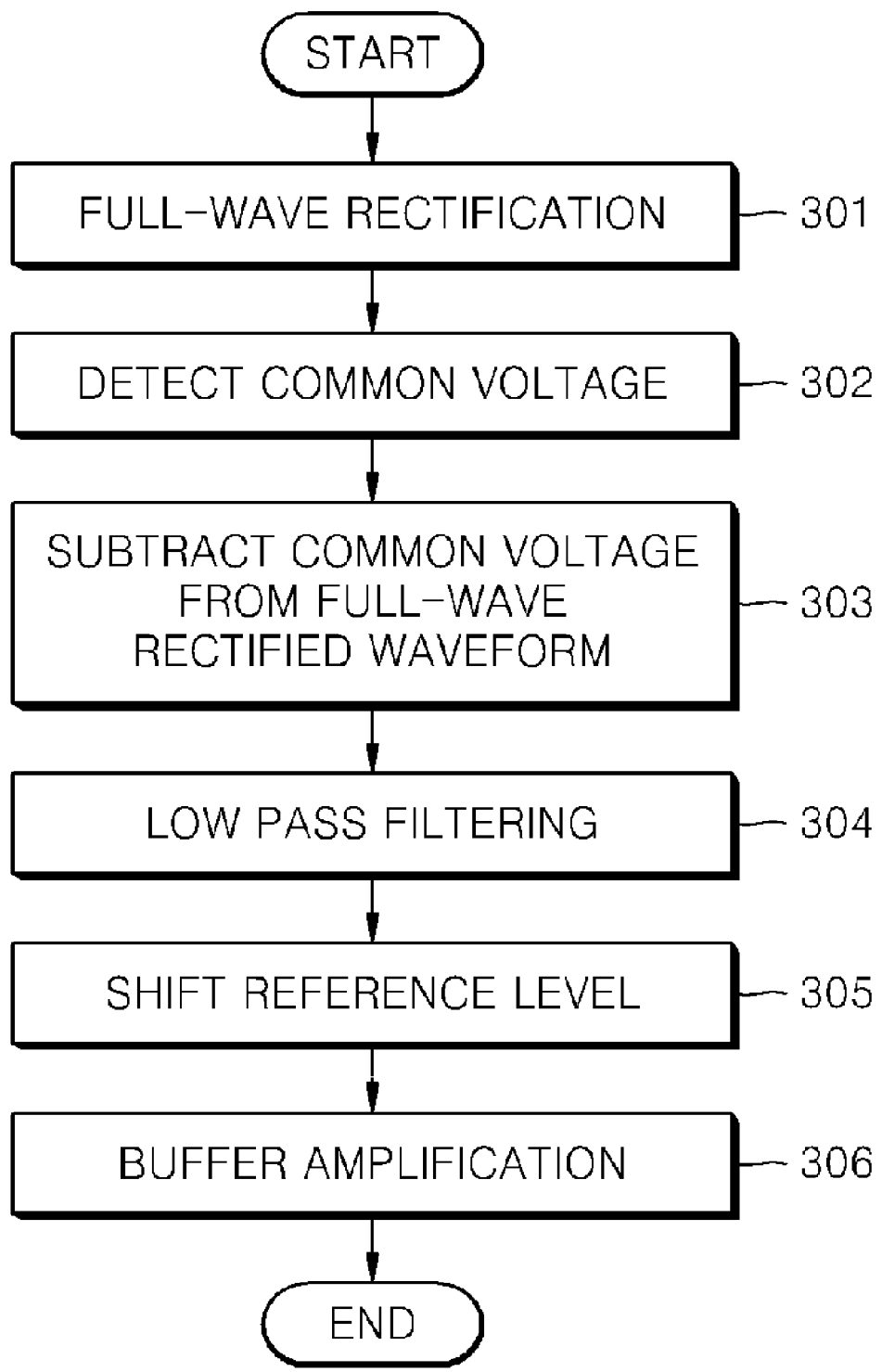

INPUT SIGNAL LEVEL DETECTION APPARATUS AND METHOD

CROSS-REFERENCE TO RELATED APPLICATION

This application claims the benefit of Korean Patent Application No. 2008-1436, filed on Jan. 4, 2008, in the Korean Intellectual Property Office, the disclosure of which is incorporated herein by reference.

BACKGROUND OF THE INVENTION

1. Field of the Invention

Aspects of the present invention relate to an input signal level detection apparatus and method, and more particularly, to an apparatus and method for detecting a level corresponding to an effective value of an input signal.

2. Description of the Related Art

An effective value, also called a root mean square value (RMS), is used to represent a magnitude of an analog signal. Detecting a level corresponding to an effective value of an input signal includes detecting a mean amplitude of an input signal such as an analog signal.

A conventional analog signal level detection apparatus includes a rectifier and a plurality of operational amplifiers. Each operational amplifier, however, has an offset that changes according to a layout and a manufacturing process. For example, in a complementary metal oxide semiconductor (CMOS) process, an operational amplifier normally has an offset ranging from a few mV to tens of mV and, in some cases, has an offset ranging from 100 mV to 200 mV. Therefore, as the analog signal level detection apparatus uses more operational amplifiers, the detected level may be greatly deviated by the offset, leading to the degradation of detection accuracy. Furthermore, power consumption of the analog signal level detection apparatus may be increased.

SUMMARY OF THE INVENTION

An aspect of the present invention provides an input signal level detection apparatus and method capable of accurately detecting a level of an input signal and consuming less power than a conventional apparatus.

Another aspect of the present invention provides an input signal level detection apparatus implemented with one operational amplifier.

According to an aspect of the present invention, there is provided an input signal level detection apparatus, including: a full-wave rectifier outputting a full-wave rectified waveform by performing a full-wave rectification on a first signal corresponding to an input signal, and on a second signal having a phase difference of 180 degrees from the first signal; a common voltage detector detecting a common voltage of the first signal and the second signal; and a level detection unit detecting a level of the input signal, based on a subtraction result obtained by subtracting the common voltage from the full-wave rectified waveform.

According to another aspect of the present invention, the level detection unit may include: a subtractor subtracting the common voltage from the full-wave rectified waveform; a low pass filter low-pass-filtering an output signal of the subtractor; a level shifter shifting a reference voltage level of an output signal of the low pass filter to a reference voltage level of the first signal; and a buffer amplifier buffer-amplifying an output signal of the level shifter.

According to another aspect of the present invention, the level detection unit may include: an operational amplifier subtracting the common voltage from the full-wave rectified waveform to output a subtraction result signal, and performing a buffer amplification operation; a low pass filter disposed between the full-wave rectifier and one input terminal of the operational amplifier to low-pass-filter the subtraction result signal; and a level shifter shifting a reference voltage level of the low-pass-filtered signal to a reference voltage level of the first signal.

According to another aspect of the present invention, there is provided an input signal level detection method, including: performing a full-wave rectification on a first signal corresponding to an input signal, and on a second signal having a phase difference of 180 degrees from the first signal; detecting a common voltage of the first signal and the second signal; and detecting a level of the input signal, based on a subtraction result obtained by subtracting the common voltage from the full-wave rectified waveform.

According to another aspect of the present invention, the detecting of the level of the input signal may include: subtracting the common voltage from the full-wave rectified waveform to output a subtraction result signal; low-pass-filtering the subtraction result signal; and shifting a reference voltage level of the low-pass-filtered signal to a reference voltage level of the first signal.

According to another aspect of the present invention, the detecting of the level of the input signal may further include buffer-amplifying the shifted signal.

According to another aspect of the present invention, the detecting of the level of the input signal may be performed using one operational amplifier, a resistor array, and a capacitor.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 3 is a flowchart illustrating an input signal level detection method according to an embodiment of the present invention.

DETAILED DESCRIPTION OF THE EMBODIMENTS

Figure 1:
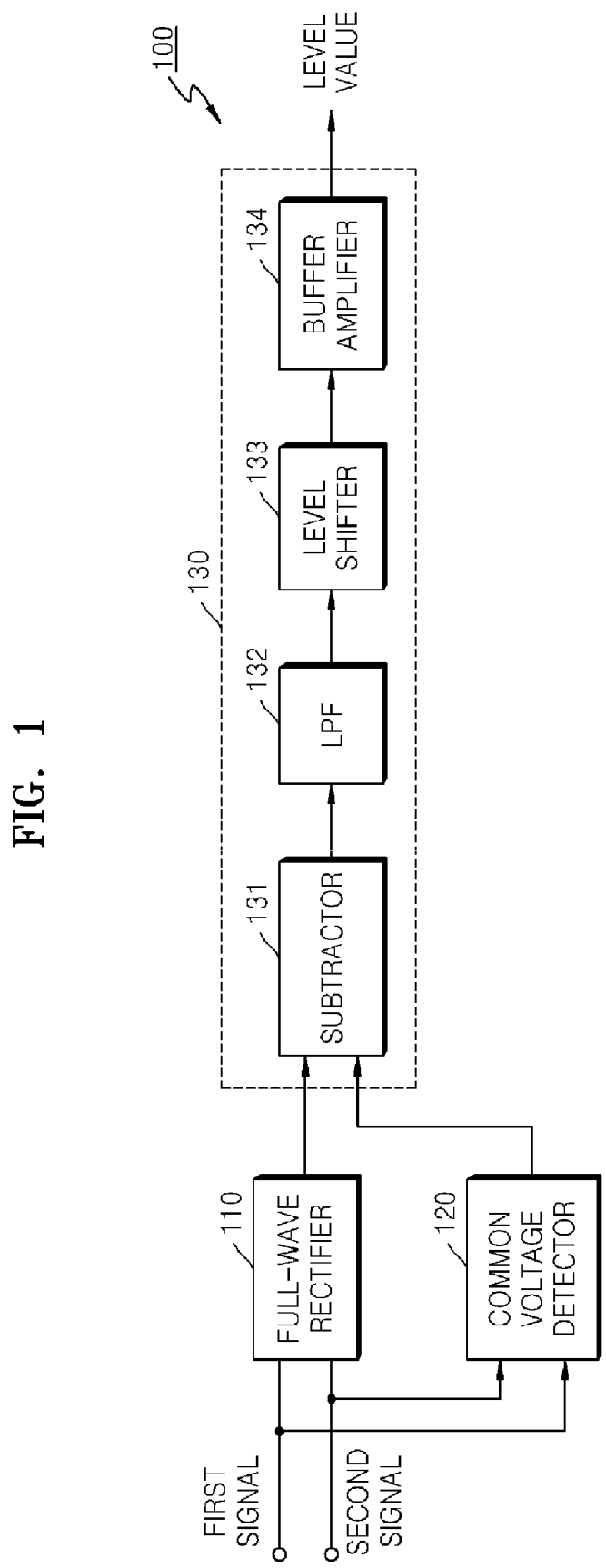
FIG. 1 is a functional block diagram of an input signal level detection apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

An aspect of the present invention will now be described more fully with reference to the accompanying drawings, in which exemplary embodiments of the invention are shown.

An input signal level detection apparatus and method according to aspects of the present invention detect a level of an input signal by using one operational amplifier. In particular, the input signal level detection apparatus and method receives a first signal and a second signal, which has the same amplitude as the first signal and a phase difference of 180 degrees from the first signal, and detects a common voltage of the first signal and the second signal. The use of the detected common voltage can reduce the number of operational amplifiers and the level of the input signal can be correctly detected consuming a small amount of power.

FIG. 1 is a functional block diagram of an input signal level detection apparatus 100 according to an embodiment of the present invention. Referring to FIG. 1, the input signal level detection apparatus 100 includes a full-wave rectifier 110, a common voltage detector 120, and a level detection unit 130.

The full-wave rectifier 110 performs a full-wave rectification on a first signal corresponding to an input signal, and on a second signal having the same amplitude as that of the first signal and a phase difference of 180 degrees from the first signal. The first signal and the second signal are analog signals having voltage levels. The full-wave rectifier 110 may be implemented with a current source and paired-MOS transistors.

Figure 2:
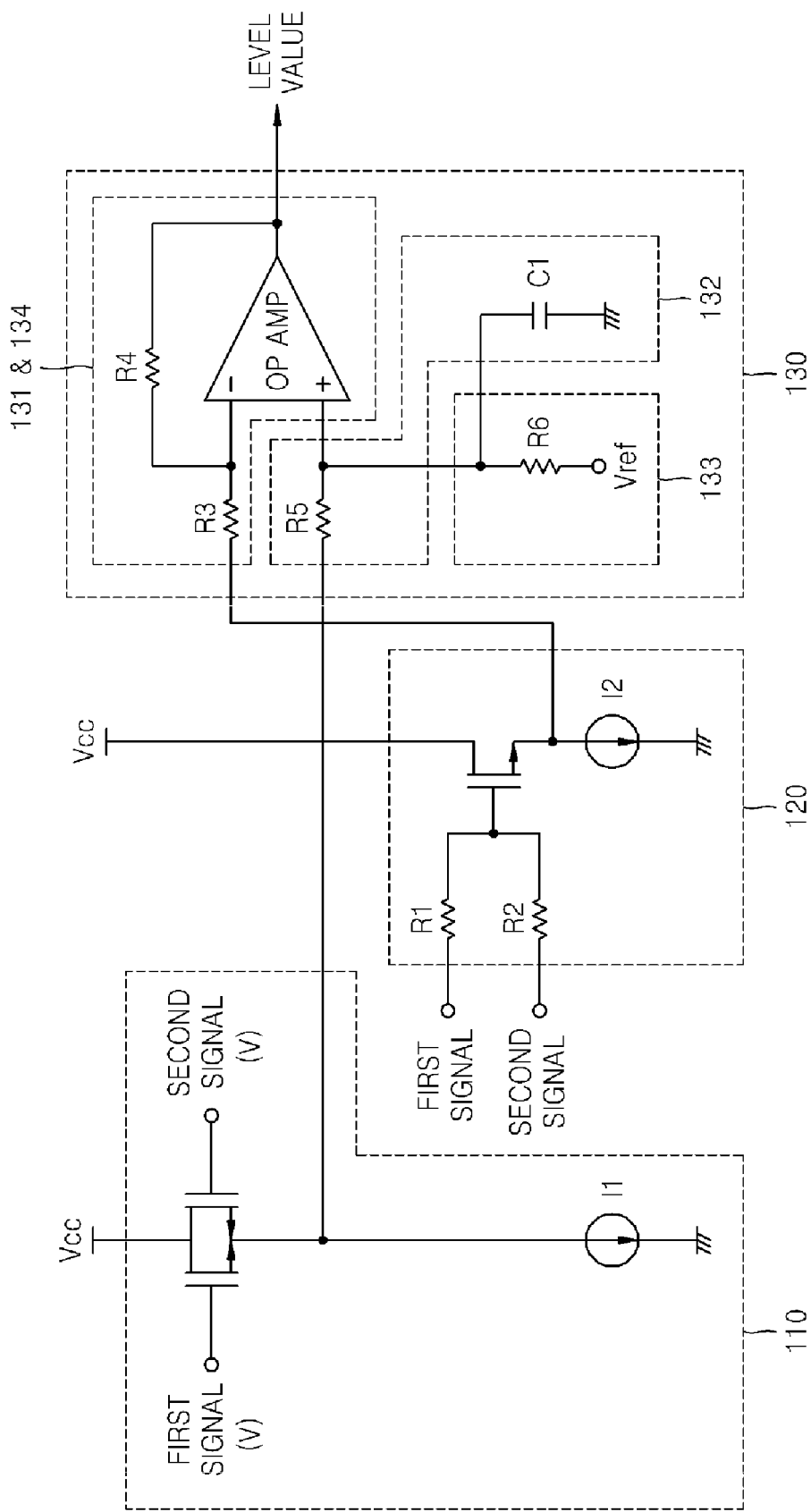
FIG. 2 is a circuit diagram of the input signal level detection apparatus according to an embodiment of the present invention.

FIG. 2 is a circuit diagram of the input signal level detection apparatus 100 of FIG. 1. As illustrated in FIG. 2, the full-wave rectifier 110 includes a current source 11 and paired-NMOS transistors, and outputs a full-wave rectified waveform of the first signal and the second signal. In the full-wave rectifier 110 of FIG. 2, the NMOS transistor receiving the first signal is turned on when the NMOS transistor receiving the second signal is turned off, whereas the NMOS transistor receiving the first input signal is turned off when the NMOS transistor receiving the second signal is turned on. In this way, the full-wave rectifier 110 outputs the full-wave rectified waveform of the first signal and of the second signal. The paired-NMOS transistors of FIG. 2 may be paired-PMOS transistors. A reference voltage level of the full-wave rectified waveform output from the full-wave rectifier 110 is shifted to a voltage level lower than a reference voltage level of the first signal by a gate-source voltage (Vgs) of the paired-NMOS transistors. The first signal has the reference voltage of Vcc/2 so as to ensure a dynamic range.

The common voltage detector 120 detects a common voltage of the first signal and the second signal. More specifically, the common voltage detector 120 calculates a mean value of the first signal and the second signal, and detects a direct current (DC) voltage as the common voltage. The DC voltage is obtained by subtracting the gate-source voltage (Vgs) of the paired NMOS transistors from the calculated mean value.

The common voltage detector 120 may be implemented with a resistor and a current source. For example, as illustrated in FIG. 2, the common voltage detector 120 may detect the DC voltage by using a plurality of resistors R1 and R2, an NMOS transistor, and a current source 12. A level of the DC voltage output from the common voltage detector 120 may have the same level as the reference voltage level of the full-wave rectified waveform.

The level detection unit 130 detects a level of the first signal, based on a subtraction result obtained by subtracting the DC voltage from the full-wave rectified waveform. The level of the first signal can be an effective DC component.

The level detection unit 130 includes a subtractor 131, a low pass filter (LPF) 132, a level shifter 133, and a buffer amplifier 134.

The subtractor 131 subtracts the common voltage, which is output by the common voltage detector 120, from the full-wave rectified waveform, which is output by the full-wave rectifier 110. The output signal of the subtractor 131 is a signal in which the common voltage or the common DC voltage is cancelled from the full-wave rectified waveform. Therefore, the output signal of the subtractor 131 can be a signal in which a DC component is removed from the full-wave rectified waveform and an alternate current (AC) component alone remains.

The LPF 132 low-pass-filters the output signal of the subtractor 131. Thus, the LPF 132 outputs a signal corresponding to the DC component.

The level shifter 133 shifts a reference voltage level of the low-pass-filtered signal to the reference voltage level of the first signal. The level shifter 133 shifts the reference voltage level back into the original reference voltage level. The output signal of the level shifter 133 can be an effective DC component of the first signal.

The buffer amplifier 134 buffer-amplifies the output signal of the level shifter 133. The buffer amplification allows the output signal of the level shifter 133 to drive a component (not shown) provided at a next stage of the buffer amplifier 134. An example of the component provided at the next stage may be an analog-to-digital converter.

The level detection unit 130 may be implemented with the circuit configuration of FIG. 2 so as to implement the above-described operations of the subtractor 131, the LPF 132, the level shifter 133, and the buffer amplifier 134 with one operational amplifier.

That is, the operational amplifier and a plurality of resistors R3 and R4 serve as the subtractor 131 and the buffer amplifier 134, and a resistor R6 and a reference voltage Vref serve as the level shifter 133. A resistor R5 and a capacitor C1 serve as the LPF 132.

FIG. 3 is a flowchart illustrating an input signal level detection method according to an aspect of the present invention.

Referring to FIG. 3, a full-wave rectification is performed on a first signal corresponding to an input signal, and on a second signal having a phase difference of 180 degrees from the first signal in operation 301. The full-wave rectification on the first signal and on the second signal can be performed in a similar manner to that of FIG. 1.

In operation 302, a common voltage of the first signal and the second signal is detected. The common voltage is a DC voltage defined in FIG. 1.

In operations 303 through 306, a level of the first signal is detected, based on a subtraction result obtained by subtracting the common voltage from the full-wave rectified signal.

More specifically, the common voltage is subtracted from the full-wave rectified signal in operation 303, and the subtraction result is low-pass-filtered in operation 304. In operation 305, a reference voltage level of the low-pass-filtered signal is shifted to a reference voltage level of the first signal. In operation 306, the shifted signal is buffer-amplified. As illustrated in FIG. 2, the level detection can be performed using one operational amplifier, a resistor array, and a capacitor.

The apparatus and method according to an aspect of the present invention detects the level of the input signal by using one operational amplifier. Therefore, the level of the input signal is detected more accurately than in the conventional art, and the power consumption is reduced in the level detection of the input signal.

The invention can also be embodied as computer readable codes on a computer-readable recording medium. The computer-readable recording medium is any data storage device that can store data which can be thereafter read by a computer system. Examples of the computer-readable recording medium include read-only memory (ROM), random-access memory (RAM), CD-ROMs, magnetic tapes, floppy disks, optical data storage devices, and carrier waves (such as data transmission through the Internet). The computer-readable recording medium can also be distributed over network coupled computer systems so that the computer readable code is stored and executed in a distributed fashion.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An input signal level detection apparatus, comprising:
   a full-wave rectifier outputting a full-wave rectified waveform by performing a full-wave rectification on a first signal corresponding to an input signal, and on a second signal having a phase difference of 180 degrees from the first signal;
   a common voltage detector detecting a common voltage of the first signal and the second signal; and
   a level detection unit detecting a level of the input signal, based on a subtraction result obtained by subtracting the common voltage from the full-wave rectified waveform.

2. The input signal level detection apparatus of claim 1, wherein the level detection unit comprises:
   a subtractor subtracting the common voltage from the full-wave rectified waveform;
   a low pass filter low-pass-filtering an output signal of the subtractor;
   a level shifter shifting a reference voltage level of an output signal of the low pass filter to a reference voltage level of the first signal; and
   a buffer amplifier buffer-amplifying an output signal of the level shifter.

3. The input signal level detection apparatus of claim 1, wherein the level detection unit comprises:
   an operational amplifier subtracting the common voltage from the full-wave rectified waveform to output a subtraction result signal, and performing a buffer amplification operation;
   a low pass filter disposed between the full-wave rectifier and one input terminal of the operational amplifier to low-pass-filter the subtraction result signal; and
   a level shifter shifting a reference voltage level of the low-pass-filtered signal to a reference voltage level of the first signal.

4. An input signal level detection method, comprising:
   performing a full-wave rectification on a first signal corresponding to an input signal, and on a second signal having a phase difference of 180 degrees from the first signal and outputting a full-wave rectified waveform;
   detecting a common voltage of the first signal and the second signal; and
   detecting a level of the input signal, based on a subtraction result obtained by subtracting the common voltage from the full-wave rectified waveform.

5. The input signal level detection method of claim 4, wherein the detecting of the level of the input signal comprises:
   subtracting the common voltage from the full-wave rectified waveform to output a subtraction result signal;
   low-pass-filtering the subtraction result signal; and
   shifting a reference voltage level of the low-pass-filtered signal to a reference voltage level of the first signal.

6. The input signal level detection method of claim 5, wherein the detecting of the level of the input signal further comprises buffer-amplifying the shifted signal.

7. The input signal level detection method of claim 6, wherein the detecting of the level of the input signal is performed using one operational amplifier, a resistor array, and a capacitor.

8. The input signal level detection apparatus of claim 1, wherein the full-wave rectifier includes a current source and paired transistors.

9. The input signal level detection apparatus of claim 8, wherein a first transistor of the paired transistors receiving the first signal is turned on when a second transistor of the paired transistors receiving the second signal is turned off and wherein the first transistor of the paired transistors receiving the first input signal is turned off when the second transistor of the paired transistors receiving the second signal is turned on.

10. The input signal level detection apparatus of claim 8, wherein a reference voltage level of the full-wave rectified waveform output from the full-wave rectifier is shifted to a voltage lower than a reference voltage level of the first signal by a gate-source voltage (Vgs) of the paired transistors.

11. The input signal level detection apparatus of claim 8, wherein the paired transistors include NMOS transistors or PMOS transistors.

12. The input signal level detection apparatus of claim 1, wherein the first signal has a reference voltage of Vcc/2.

13. An input signal level detection apparatus, comprising:
   a full-wave rectifier outputting a full-wave rectified waveform by performing a full-wave rectification on a first signal corresponding to an input signal, and on a second signal having a phase difference of 180 degrees from the first signal;
   a common voltage detector detecting a common voltage of the first signal and the second signal; and
   a level detection unit including a single operational amplifier detecting a level of the input signal, based on a subtraction result obtained by subtracting the common voltage from the full-wave rectified waveform.

14. The input signal level detection apparatus of claim 13, wherein the level detection unit further comprises:
   a subtractor subtracting the common voltage from the full-wave rectified waveform;
   a low pass filter low-pass-filtering an output signal of the subtractor; and
   a level shifter shifting a reference voltage level of an output signal of the low pass filter to a reference voltage level of the first signal.

15. The input signal level detection apparatus of claim 13, wherein the level detection unit further comprises:
   a low pass filter disposed between the full-wave rectifier and one input terminal of the operational amplifier to low-pass-filter the subtraction result signal; and
   a level shifter shifting a reference voltage level of the low-pass-filtered signal to a reference voltage level of the first signal.

16. The input signal level detection apparatus of claim 13, wherein the full-wave rectifier includes a current source and paired transistors.

17. The input signal level detection apparatus of claim 16, wherein a first transistor of the paired transistors receiving the first signal is turned on when a second transistor of the paired transistors receiving the second signal is turned off and wherein the first transistor of the paired transistors receiving the first input signal is turned off when the second transistor of the paired transistors receiving the second signal is turned on.

18. The input signal level detection apparatus of claim 16, wherein the paired transistors include NMOS transistors or PMOS transistors.

* * * * *